(12) United States Patent
d'Haene et al.

(10) Patent No.: US 7,049,869 B2
(45) Date of Patent: May 23, 2006

(54) ADAPTIVE LOCK POSITION CIRCUIT

(75) Inventors: Wesley C. d'Haene, Burlington (CA); Atul K. Gupta, Mississauga (CA)

(73) Assignee: Gennum Corporation (CA)

( * ) Notice: Subject to any disclaimer, the term of this patent is extended or adjusted under 35 U.S.C. 154(b) by 15 days.

(21) Appl. No.: 10/931,508

(22) Filed: Sep. 1, 2004

(65) Prior Publication Data

US 2005/0046456 A1    Mar. 3, 2005

Related U.S. Application Data

(60) Provisional application No. 60/567,614, filed on May 3, 2004, provisional application No. 60/499,436, filed on Sep. 2, 2003.

(51) Int. Cl.
*H03K 5/01* (2006.01)

(52) U.S. Cl. ........................... 327/165; 327/156

(58) Field of Classification Search ............... 327/1–2, 327/7–8, 12, 156–158, 147–148, 16
See application file for complete search history.

(56) References Cited

U.S. PATENT DOCUMENTS

| | | | |
|---|---|---|---|
| 4,458,355 A | 7/1984 | Motley et al. | |
| 4,941,151 A | 7/1990 | Abbiate et al. | |
| 5,093,847 A | 3/1992 | Cheng | |
| 5,159,292 A | 10/1992 | Canfield et al. | |
| 5,298,867 A | 3/1994 | Mestha | |
| 5,539,357 A | 7/1996 | Rumreich | |
| 5,581,585 A | 12/1996 | Takatori et al. | |
| 5,818,304 A | 10/1998 | Hogeboom | |
| 5,828,255 A | 10/1998 | Kelkar et al. | |
| 6,133,783 A | 10/2000 | Stockman et al. | |
| 6,178,213 B1 | 1/2001 | McCormack et al. | |
| 6,275,555 B1 | 8/2001 | Song | |
| 6,285,722 B1 | 9/2001 | Banwell et al. | |
| 6,463,109 B1 | 10/2002 | McCormack et al. | |
| 6,496,556 B1* | 12/2002 | Huehne et al. ............... 377/2 |
| 6,531,926 B1 | 3/2003 | Pate et al. | |
| 6,587,531 B1 | 7/2003 | De Mey et al. | |

(Continued)

FOREIGN PATENT DOCUMENTS

| WO | WO 02/19528 A2 | 3/2002 |
|---|---|---|
| WO | WO 03/013001 | 2/2003 |

OTHER PUBLICATIONS

McCormack, Gary, "Intelligent Data Recovery", CSD Dec. 1999 Feature: Intelligent Data Recovery, pp. 1-19.

*Primary Examiner*—Dinh T. Le
(74) *Attorney, Agent, or Firm*—Jones Day

(57) ABSTRACT

An adaptive lock position circuit includes a jitter distribution extremity detector and a phase shifting circuit. The jitter distribution extremity detector receives an input data signal and is operable to compare the input data signal with one or more clock signals derived from a recovered clock signal from a clock and data recovery (CDR) circuit to generate one or more control signals that define the boundaries of a jitter extremity detection window. The phase shifting circuit is coupled in a feedback loop with the jitter distribution extremity detector and receives the one or more control signals from the jitter distribution extremity detector and also receives the recovered clock signal. The phase shifting circuit is operable to shift the phase of the recovered clock signal as a function of the one or more control signals to generate a retiming clock signal such that an edge of the retiming clock signal is interpolated within the jitter extremity detection window.

26 Claims, 11 Drawing Sheets

U.S. PATENT DOCUMENTS

| | | |
|---|---|---|
| 6,615,361 B1 | 9/2003 | Patapoutian |
| 6,686,777 B1 | 2/2004 | Kariquist |
| 6,721,328 B1 | 4/2004 | Nichols et al. |
| 6,738,922 B1 | 5/2004 | Warwar et al. |
| 2003/0031282 A1 | 2/2003 | McCormack et al. |

* cited by examiner

ADAPTIVE LOCK POSITION CIRCUIT

CROSS-REFERENCE TO RELATED APPLICATION

This application claims priority from and is related to the following prior applications: "Adaptive Lock Position Circuit," U.S. Provisional Application No. 60/499,436, filed Sep. 2, 2003; and "Adaptive Lock Position Based CDR PLL Architectures," U.S. Provisional Application No. 60/567,614, filed May 3, 2004. These prior applications, including the entire written descriptions and drawing figures, are hereby incorporated into the present application by reference.

FIELD

The technology described in this patent document relates generally to data communication systems. More specifically, this document describes an adaptive lock position circuit that is particularly well-suited for use in a clock and data recovery (CDR) system.

BACKGROUND

Transmitting data through back-planes (routers) or optical systems is common for many data communications systems and networks. Due to limitations of various components in such systems, large pattern jitter is often introduced that causes distinct eye patterns to occur, most notably those with skewed and asymmetric jitter distributions (or histograms). Typical phase detectors, whether of the linear or non-linear type, do not lock the recovered clock to an ideal position within such an input data jitter distribution, thus reducing the effective total input jitter tolerance of a clock and data recovery circuit. In such cases, the use of typical phase detectors and CDR circuits can cause undesirable behavior, such as bit errors, even if the eye opening of the input data signal is wide enough to properly retime the input data using a decision circuit.

SUMMARY

An adaptive lock position circuit includes a jitter distribution extremity detector and a phase shifting circuit. The jitter distribution extremity detector receives an input data signal and is operable to compare the input data signal with one or more clock signals derived from a recovered clock signal from a clock and data recovery (CDR) circuit to generate one or more control signals that define the boundaries of a jitter extremity detection window. The phase shifting circuit is coupled in a feedback loop with the jitter distribution extremity detector and receives the one or more control signals from the jitter distribution extremity detector and also receives the recovered clock signal. The phase shifting circuit is operable to shift the phase of the recovered clock signal as a function of the one or more control signals to generate a retiming clock signal such that an edge of the retiming clock signal is interpolated within the jitter extremity detection window.

DESCRIPTION

Standard CDR and PLL circuits that utilize linear or non-linear phase detectors typically have a lock position determined by either the weighted mean or the median of the input jitter distribution, respectively. The operation of a typical phase detector is illustrated by the timing diagram 10 shown in FIG. 1.

Figure 1:
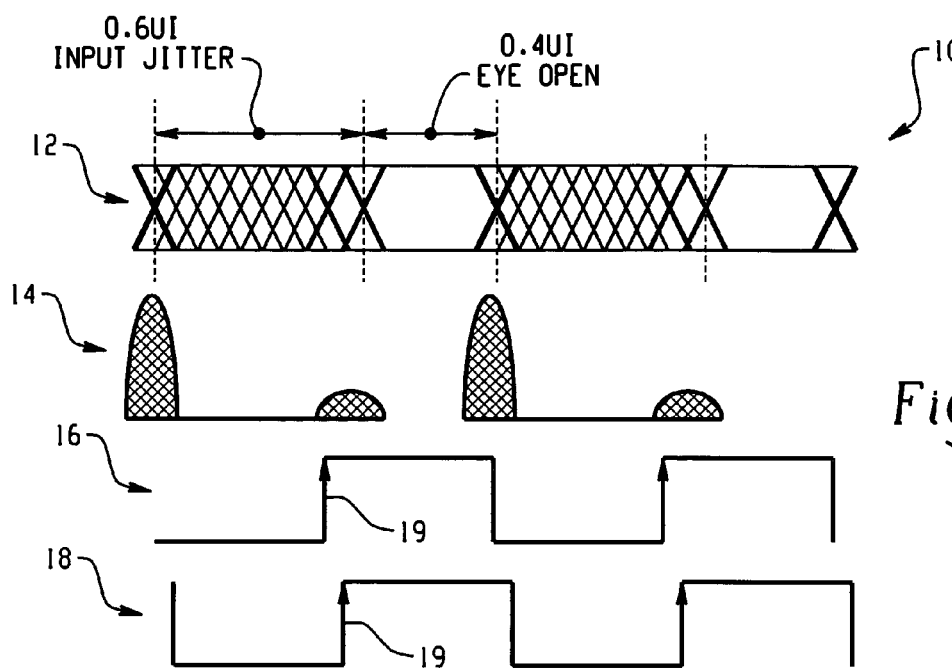
FIG. 1 illustrates an example input data eye pattern and corresponding jitter histogram for a typical phase detector in a clock and data recovery circuit.

The timing diagram 10 shown in FIG. 1 illustrates an example input data eye pattern 12 and corresponding jitter histogram 14 for a typical phase detector in a clock and data recovery circuit (CDR). Also shown in FIG. 1 are standard non-linear and linear CDR lock positions 16, 18 for the recovered clock in a standard CDR circuit. The illustrated input data eye pattern 12 has an input jitter of 0.6 UI (unit intervals), leaving an open eye pattern of only 0.4 UI. That is, 60 percent of the eye can be considered closed due to jitter.

As illustrated by the bold crossing points in the input data eye diagram 12, the majority of data edges in the input eye pattern typically occur in one position, and the remaining edges occur up to 0.6 UI from the first position. A typical CDR circuit will align the falling edge of the recovered clock 16, 18 very close to the position where the majority of data edges occur. This clock alignment may, however, result in undesired bit errors occurring in the retimed output data signal because the rising edge 19 of the retiming clock 16, 18 does not occur within the eye opening. Thus, the CDR circuit behaves as if the input jitter tolerance performance is degraded when it encounters inputs as shown in FIG. 1.

Figure 2:
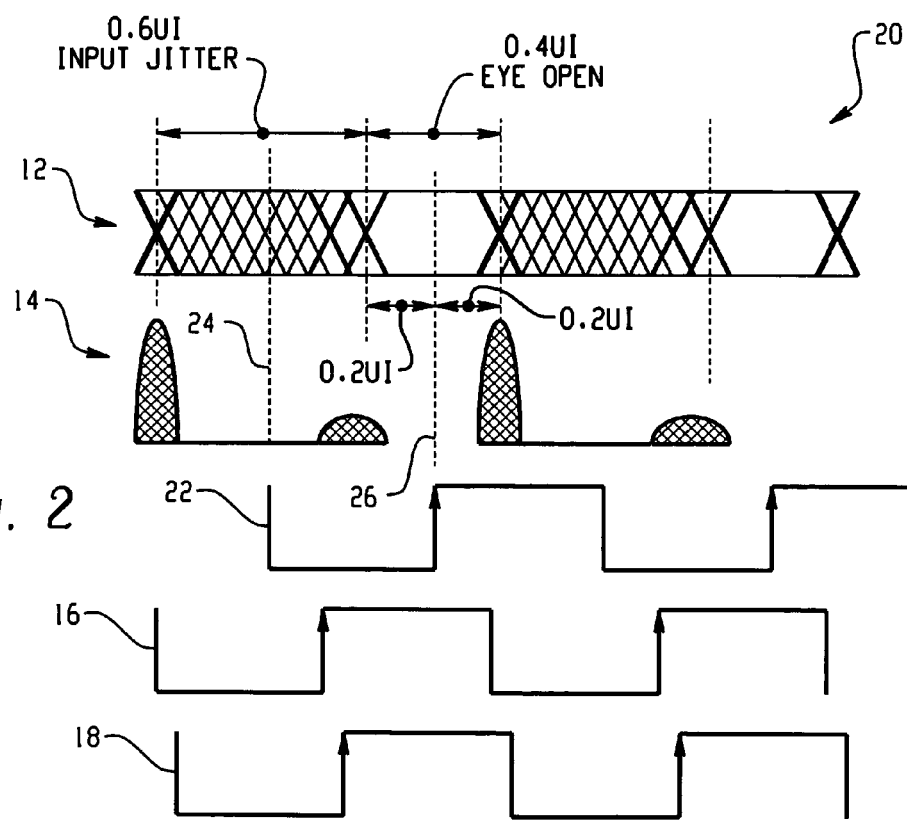
FIG. 2 is a timing diagram illustrating an ideal recovered clock lock position for the input data eye diagram and corresponding jitter histogram of FIG. 1.

FIG. 2 is a timing diagram 20 illustrating an ideal recovered clock lock (and retiming) position 22 for the input data eye diagram 12 and corresponding jitter histogram 14 of FIG. 1. The ideal recovered clock lock position 22 is achieved by shifting the recovered clock to the right relative to the original lock position 16, 18 determined by the CDR circuit. This additional ideal retiming clock signal 22 is generated by shifting the phase of the recovered clock (16 or 18) such that the falling edge is centered between the data edge extremities of the input data 12 (illustrated by vertical reference 24.) It follows that the rising clock edge will then be centered within the eye opening (illustrated by vertical reference 26.) In the illustrated eye diagram 12, the rising clock edge is positioned such that there is 0.2 UI of setup and hold margin remaining for the retiming circuit to sample the input data signal 12.

Figure 3:
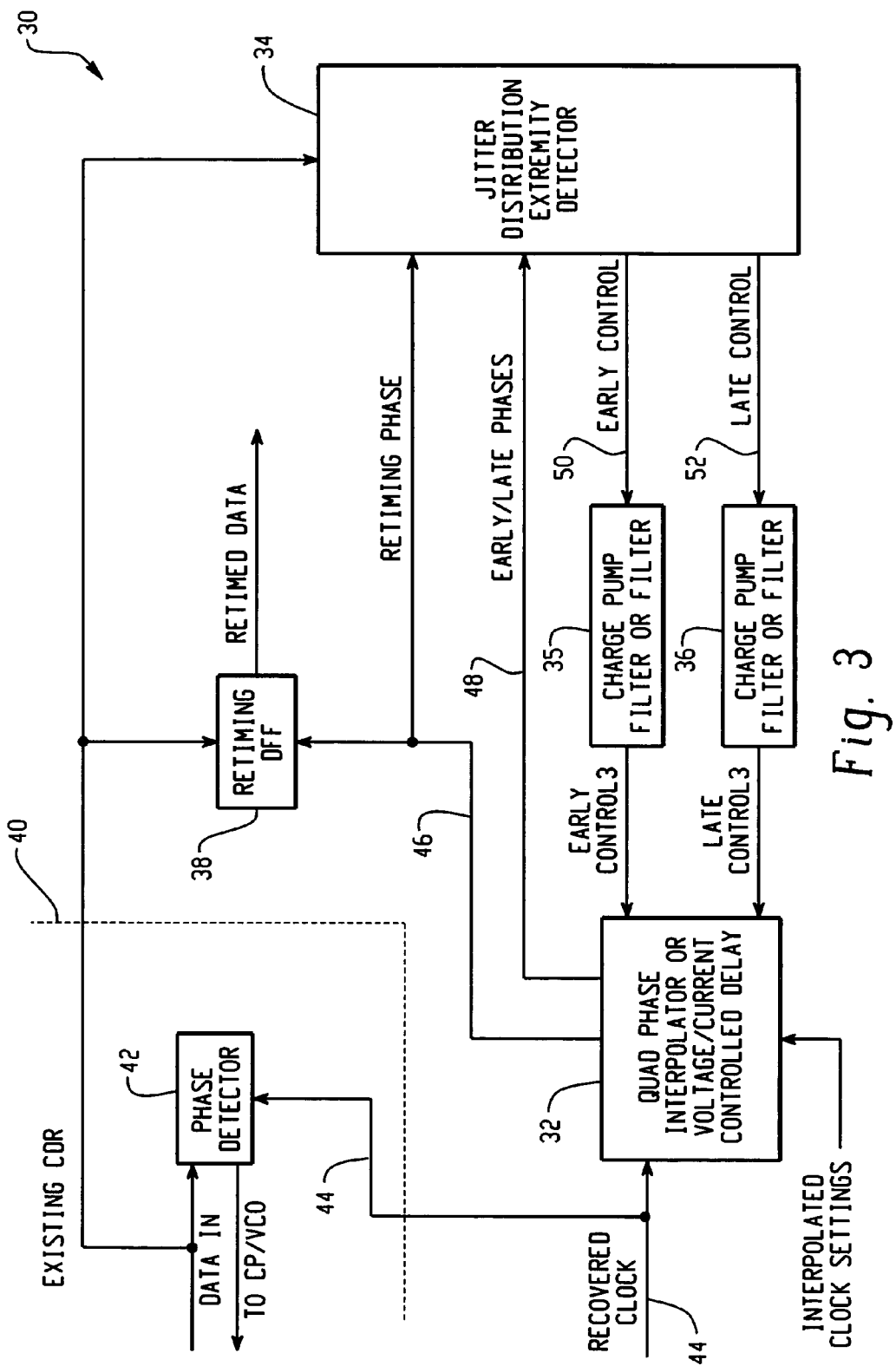
FIG. 3 is a block diagram of an example adaptive lock position circuit.

FIG. 3 is a block diagram of an example adaptive lock position circuit 30. The example adaptive lock position circuit 30 illustrated in FIG. 3 may preferably be built around any existing CDR or PLL circuit in order to generate a retiming phase 46 utilizing the recovered clock 44 so that the retiming phase 46 is adapted to the input jitter distribution (jitter histogram). This allows for an improved input jitter tolerance of a given CDR or PLL regardless of the jitter histogram shape.

The adaptive lock position system 30 includes a phase shifting circuit 32, a jitter distribution extremity detector 34, two charge pumps 35, 36, and a retiming latch or flip-flop 38. The phase shifting circuit 32 may be operable to provide a configurable phase offset for the retiming clock phase 46 (via the interpolated clock setting input.) Also illustrated is a CDR circuit 40 including a phase detector 42.

The phase shifting circuit 32 may, for example, be a quad phase interpolator or a voltage/current controlled delay circuit. The phase shifting circuit 32 is operational to adjust the phase of the recovered clock signal 44 such that the retiming clock signal 46 is centered within the open input data eye, as illustrated in FIG. 2. However, the system may also be configured such that the retimed clock signal 46 is left or right of center within the open input data eye for select applications. The phase shifting circuit 32 also provides additional clock phases 48 of the recovered clock signal 44. The jitter distribution extremity detector (jitter detector) 34 is operable to determine the direction and the amount that the retiming clock signal 44 is shifted by the phase shifting circuit 32. An example jitter detector circuit 34 is described below with reference to FIGS. 7–9. The charge pumps 35, 36 may, for example, be realized by an analog filter, a digital filter (e.g., counter), or some combination thereof. In one embodiment, the two charge pumps 35, 36 may be realized by a single, two-input charge pump.

In operation, the jitter detector 34 utilizes the clock phases 46, 48 generated by the phase shifting circuit 32 to define a jitter extremity detection window (jitter detection window) encompassing all of the data transitions within less than a unit interval (UI). Transitions that occur beyond the defined jitter detection window are treated as jitter extremity events. Upon detecting a jitter extremity event outside of the jitter detection window, the jitter detector 34 determines which side of the jitter detection window the extremity event occurred, and generates one or more controls signals 50, 52 to instruct the phase shifting circuit 32 to adjust the phase of the retiming clock signal 46 to a more ideal position. The control signals 50, 52 from the jitter detector 34 are input to the charge pumps 35, 36, which convert the control signals 50, 52 into one or more analog control signals (early control 3 and late control 3). An example charge pump 35, 36 and phase shifting circuit 32 is described below with reference to FIG. 13.

The phase shifting circuit 32 uses the recovered clock signal 44 to generate an inverted recovered clock signal. The inverted recovered clock signal can be internally generated in the phase shifting circuit 32 from a polarity inversion of the recovered clock 44 (inversion provides a 180 degree phase shift.) With the inverted recovered clock as a reference, two other clock phases can be generated—an early clock signal and a late clock signal 48. An interpolated clock is generated from the early and late control information provided by the charge pump(s) 35, 36. The interpolated clock phase is by default the mid-point between the early and late clock phases. The interpolated clock setting signal can be used to adjust this default setting to a phase before or after the mid-point of the early or late clock phases. The retiming clock signal 46 is an inversion of the interpolated clock signal, which is generally centered between the early clock and the late clock. The control signals 50, 52 from the jitter detector 34 are used by the phase shifting circuit 32 to adjust the phase of the early or late clock signal 48, resulting in a corresponding shift in the phase of the retiming clock signal 46.

Figure 4:
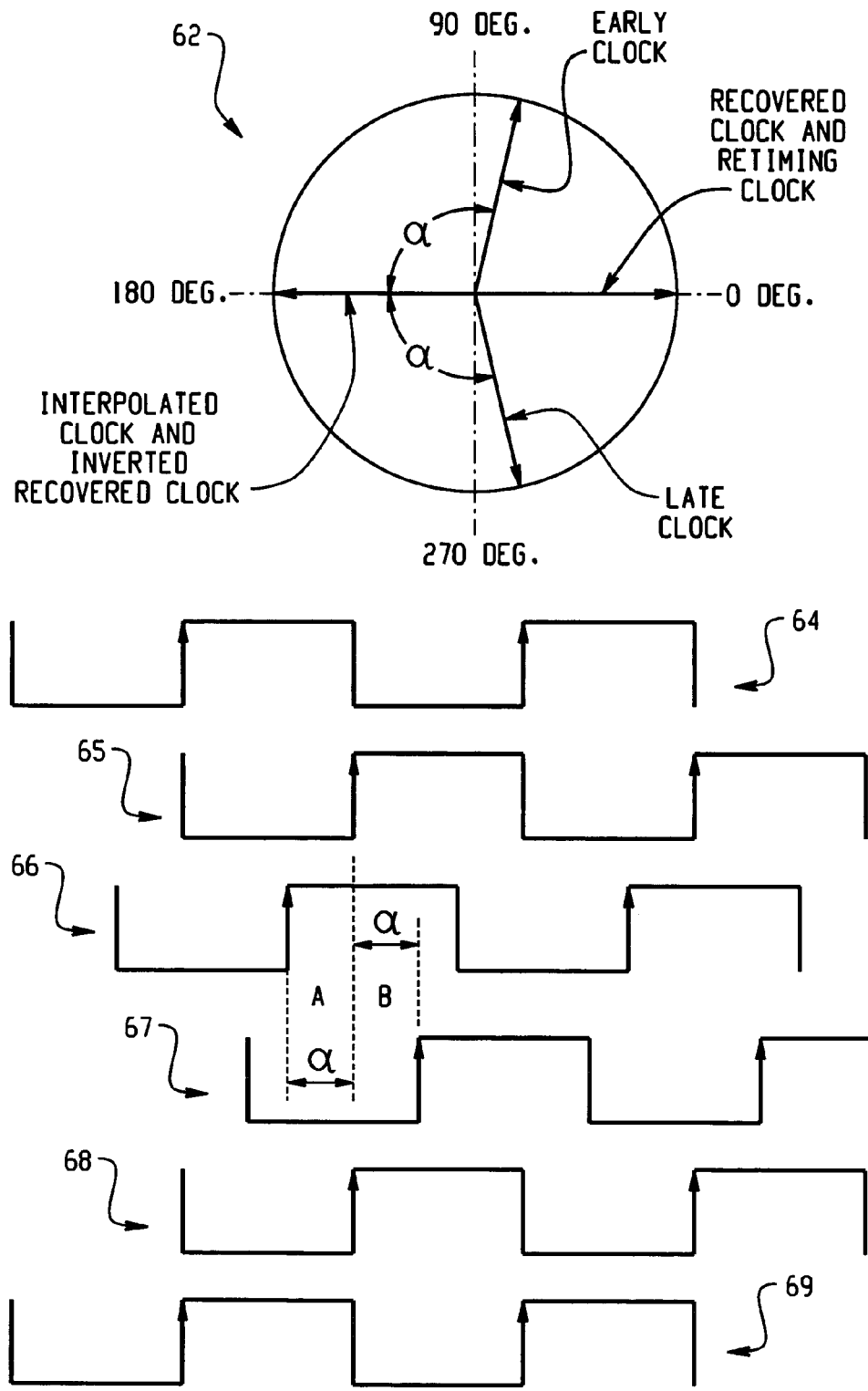
FIG. 4 illustrates a jitter extremity detection window timing diagram and equivalent phasor diagram.

FIG. 4 illustrates the concept of the jitter extremity detection window (jitter detection window) and the equivalent phasor diagram 62 for a case in which the input jitter is symmetrical. FIG. 4 includes a timing diagram showing the recovered clock lock position 64, the inverted recovered clock phase 65, the early clock phase 66, the late clock phase 67, the interpolated clock phase 68, and the retiming clock phase 69. The width of the left half of the jitter detection window is defined as A=α, which is determined by the position of the early clock phase 66. The width of the right half of the jitter detection window is defined as B=α, which is determined by the position of the late clock phase 67. The widths A and B are defined with reference to the inverted recovered clock phase 65. The sum of A plus B should be less than 1 UI. Furthermore, depending upon the implementation of the jitter detector 34, the jitter detection window size (A+B) might be of fixed size (static window) or variable size (dynamic window). Generally, a variable window size is of most practical use and would provide the best adaptation performance. In the timing example of FIG. 4, if all of the data transitions occur within the jitter detection window (i.e., the histogram is contained within the window, and in this case, is symmetrical), then the jitter detector would indicate that no phase adjustment of the retiming clock is required (e.g., early control 50 and late control 52 are both continuously logic low).

Figure 5:
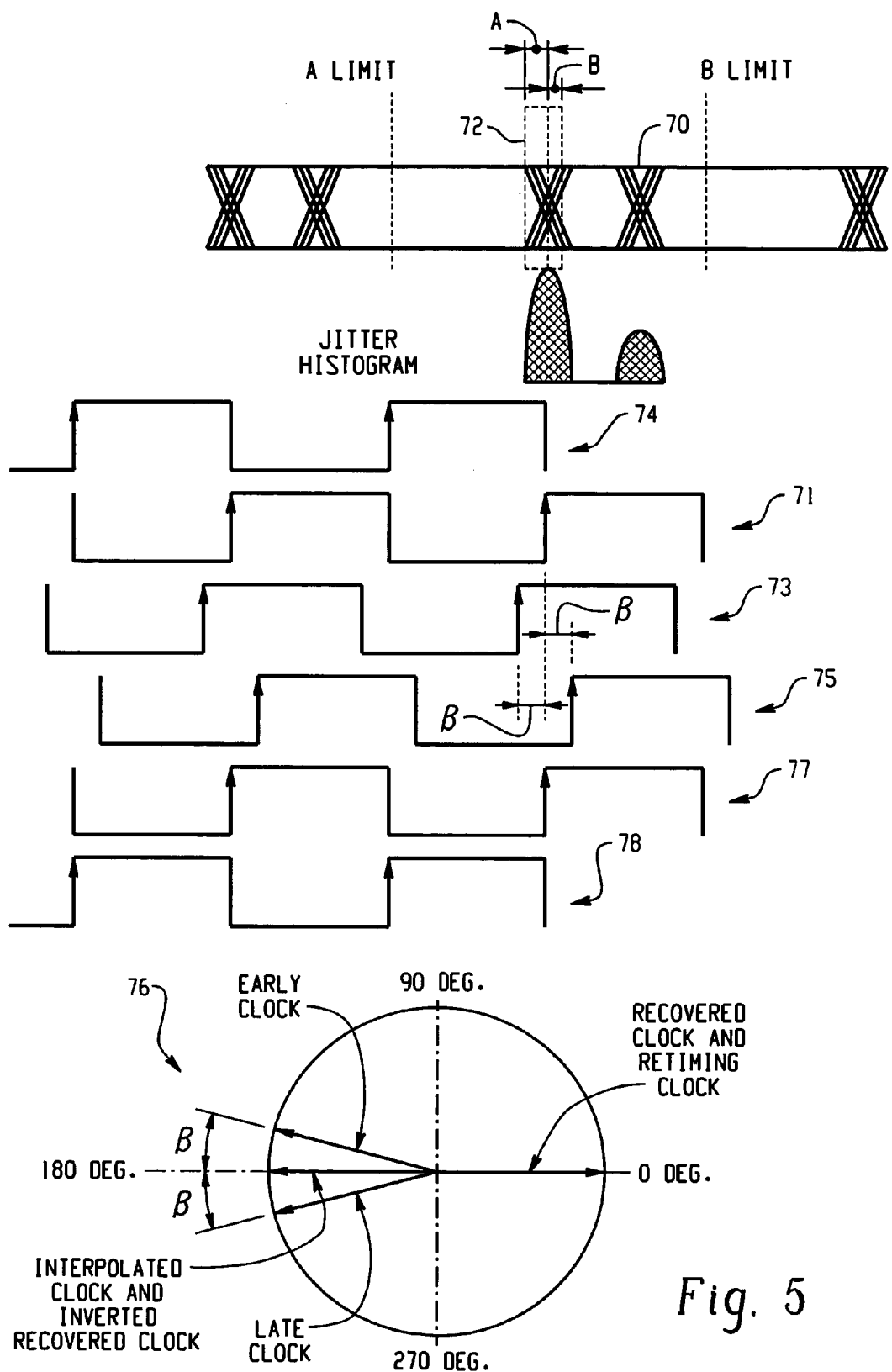
FIG. 5 illustrates an example of data edges occurring outside of a defined jitter extremity detection window.

FIG. 5 illustrates an example of data edges 70 occurring outside of the defined jitter extremity detection window 72 (jitter detection window). In this example, some of the data edges 70 occur outside the jitter detection window 72 on the right hand side. As a result, the jitter detector 34 should indicate that the retiming clock position 78 needs to be shifted to the right to achieve a more ideal lock position. The recovered clock 74, inverted recovered clock 71, early clock 73, late clock 75, interpolated clock 77, retiming clock 78, and the corresponding phasor diagram 76 are also shown in FIG. 5.

Figure 6:
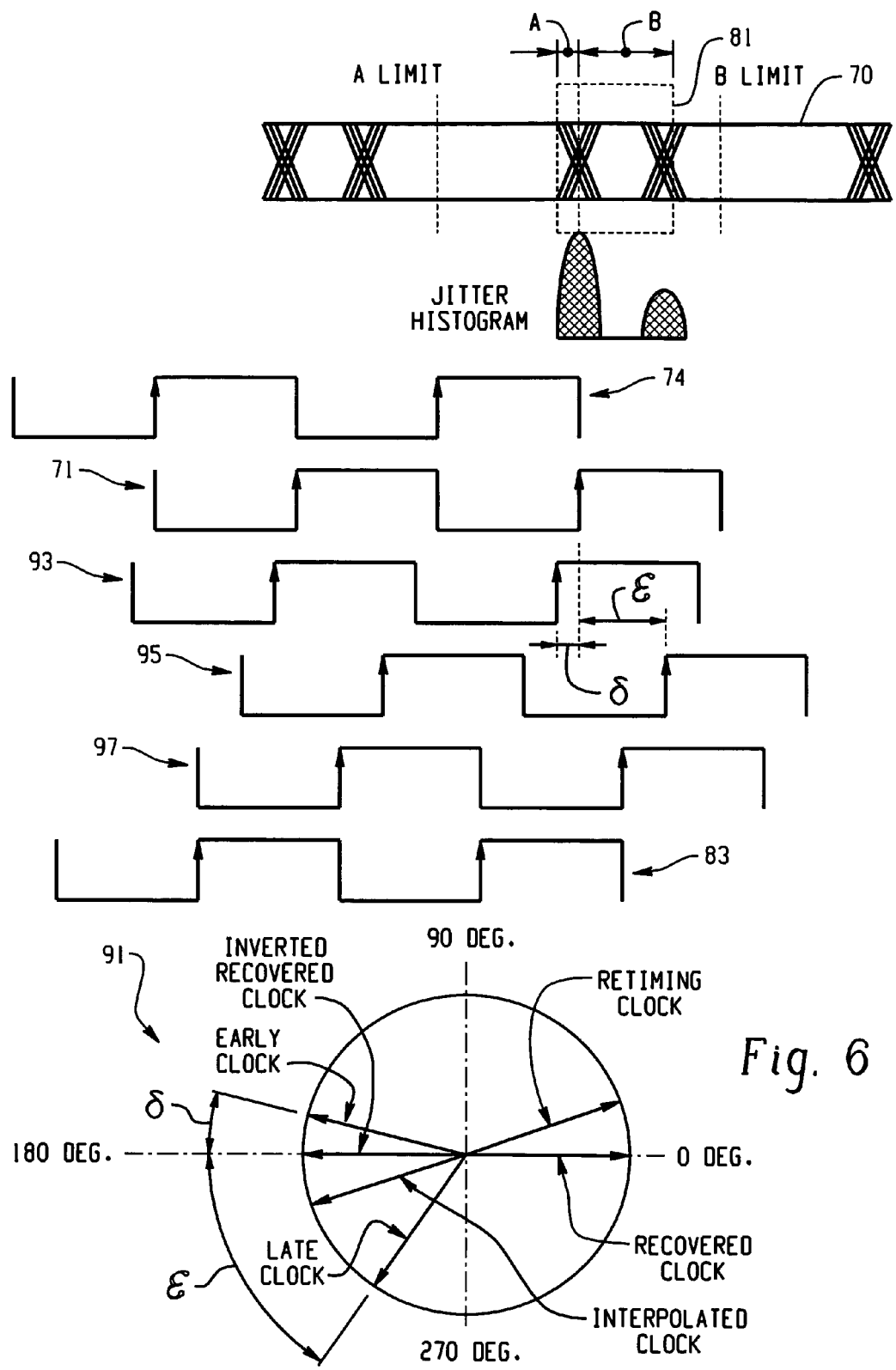
FIG. 6 illustrates the window sizing and lock position resultant from the example of FIG. 5.

Referring to the phasor diagram 76, as the early or late clock phasors rotate in order to adapt the jitter detection window to the input jitter histogram, so will the retiming/interpolated clock phasors 78, 77. Thus, shifting the phase of the early clock and late clock results in a corresponding expansion or contraction of the jitter detection window to the left or the right until the final lock position of the retiming clock 83 results, as shown in FIG. 6. The phase difference between the early and late clocks can change as the window size is adjusted. Thus, once the final lock position 83 is obtained, all of the data edges should be contained within the resultant jitter detection window 81 (A=δ+B=ε), as illustrated in FIG. 6. Also illustrated in FIG. 6 is the phasor diagram 91 corresponding to the final lock position of the retiming clock 83. The final early clock phase 93, final late clock phase 95 and final interpolated clock phase 97 are also illustrated in FIG. 6.

In a dynamic jitter detection window configuration, the widths A and B can be controlled independently in response to a data edge that occurs outside the current window to the left or to the right. For instance, consider the case in which the initial jitter detection window 72 of FIG. 5 is near zero in width. Because data edges would be occurring outside the window on the right and left side, the window would adapt such that the width B is increased by a large amount, and the width A is increased only slightly. As the width of the window is adjusted, the phase of the retiming clock 78 is also adjusted to achieve ideal phase alignment with the input data. The resulting window sizing 81 and lock position 83 is shown in FIG. 6, along with the associated phasor diagram 91.

Figure 7:
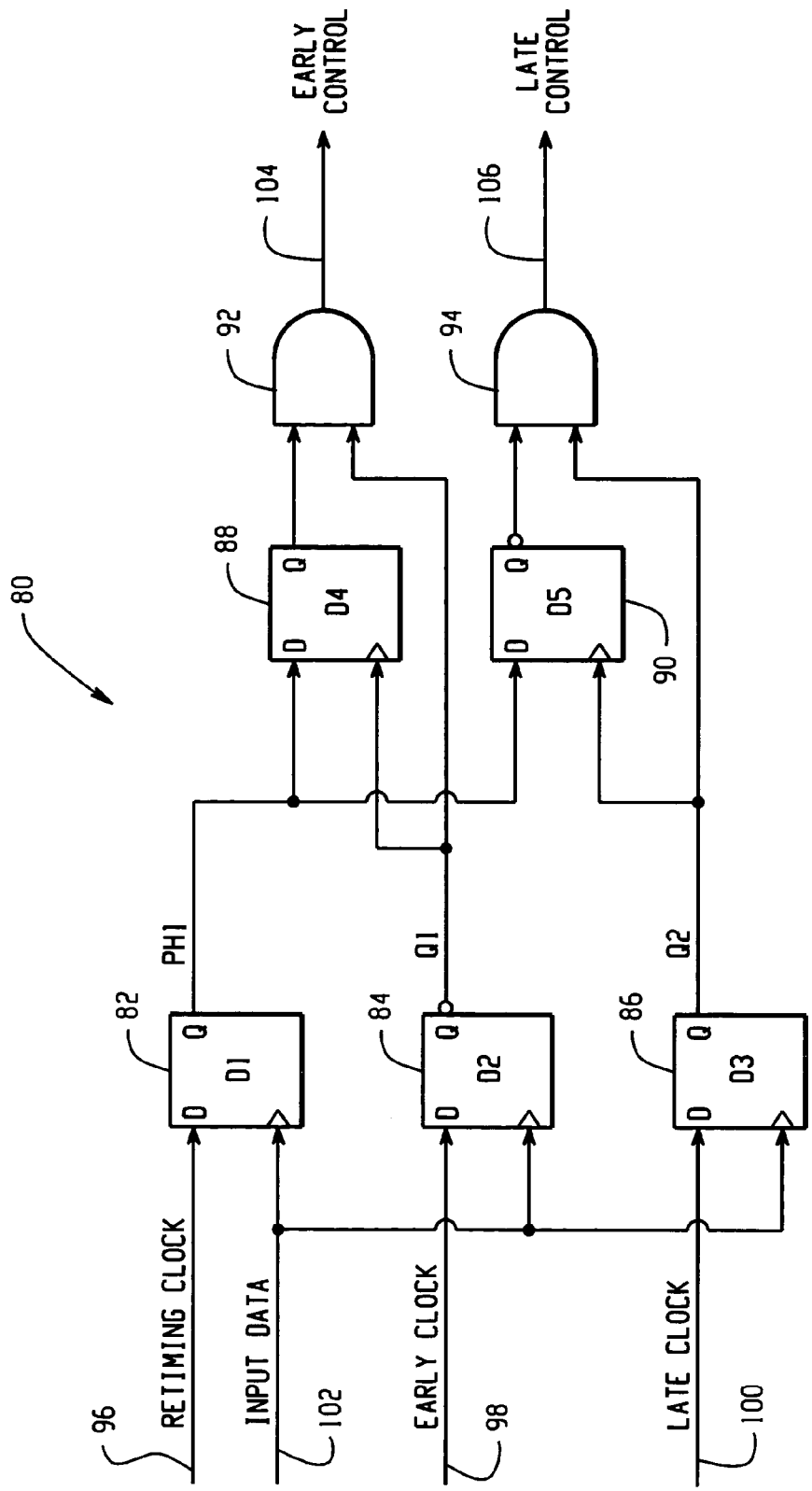
FIG. 7 is a diagram of an example jitter distribution extremity detector.

FIG. 7 is a diagram of an example jitter distribution extremity detector 80 (jitter detector.) The example jitter detector 80 includes three primary stage latches (or flip-flops) 82, 84, 86 (D1, D2 and D3), two secondary stage latches (or flip-flops) 88, 90 (D4 and D5), and two output gates 92, 94. In operation, the jitter detector 80 utilizes multiple clock phases 96, 98, 100 and an input data signal 102 to realize a jitter extremity detection window, as described above. The clock phases may be generated by a phase shifting circuit 32, as described above with reference to FIG. 3.

Figure 8:
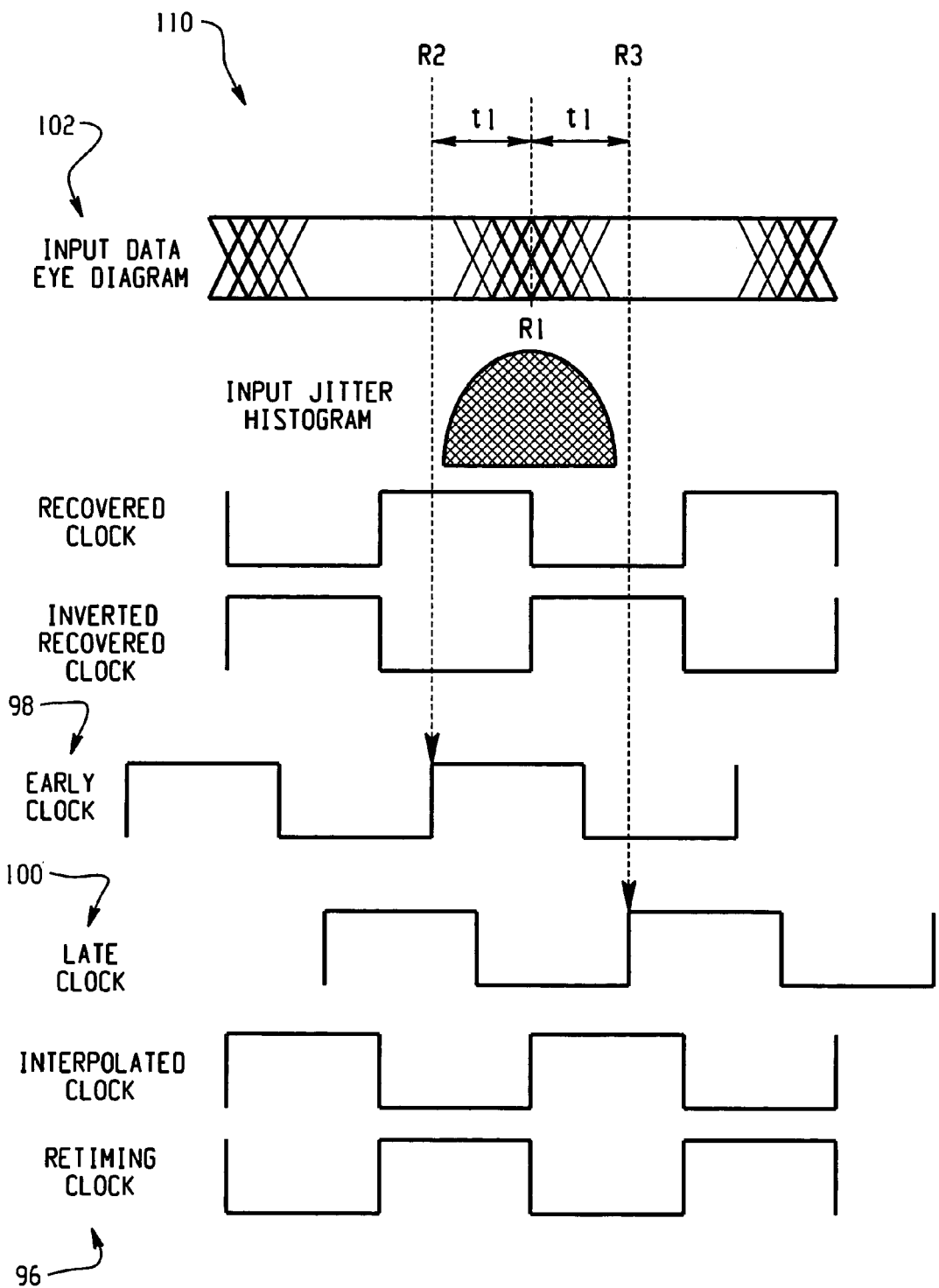
FIG. 8 is a timing diagram that further illustrates the function of the example jitter detector of FIG. 7.

The three primary stage latches 82, 84, 86 respectively sample the three clock phases 96, 98, 100 using rising data edges 102. The signal PHI is used to determine if the current data edge occurred before or after the current lock position (or current retiming clock phase). The signals Q1 and Q2 show when a data edge has crossed outside of the jitter detection window having a width defined by the delay t1, as shown in FIG. 8. The information (PH1, Q1 and Q2) is combined using the secondary stage latches 88, 90 (D4 and D5) and output gates 92, 94 to generate two output signals 104, 106 (early control and late control) that determine when data edges have occurred outside the jitter detection window and on which side the edge has occurred. The AND gates 92, 94 at the output ensure that a given output signal 104, 106 is not latched in a logic high state for an extended period of time.

FIG. 8 is a timing diagram 110 that further illustrates the function of the example jitter detector 80 of FIG. 7. The left and right edges of the jitter detection window are illustrated in FIG. 8 by vertical references R2 and R3, respectively. The delay t1 defines the effective width of the jitter detection window to the left and right. Cross-referencing FIGS. 7 and 8, if a data edge occurs while both the early clock 98 and Q1 are in a logic low state, then Q1 will transition from a logic low state to a logic high state (i.e., a rising edge will occur at the Q1 output.) Similarly, if a data edge occurs while the late clock 100 is in a logic high state and Q2 is in a logic low state, then Q2 will transition from a logic low state to a logic high state (i.e., a rising edge will occur at the Q2 output.) The PH1 output will be in a logic low state when rising data edges are lagging the retiming clock 96, and will be in a logic high state when rising data edges are leading the retiming clock 96.

For example, if a rising data edge occurs beyond point R3, then a rising edge will occur at the Q2 output, sampling a low signal at the PH1 node. Therefore, the output of D5 will be high, causing the late control output 106 to also be in a logic high state. A logic high state on the late control output 106 indicates that the retiming clock 96 needs to be shifted to the right. Conversely, if a rising data edge occurs before point R2, then a rising edge will occur at the Q1 output, sampling a high signal at the PH1 node. Therefore, the output of D4 will be high, and thus the early control output 104 will also be high. A logic high state on the early control output 104 indicates that the retiming clock 96 needs to be shifted to the left. When rising data edges occur within the jitter detection window (i.e., between R2 and R3), the Q1 and Q2 outputs will be in a logic low state, causing both the late control 106 and early control 104 outputs to be in a logic low state.

With reference to FIG. 3, the early control 104 and late control 106 outputs may be fed back to the phase shifting circuit 32 via the charge pump(s) or filter(s) 35, 36. In this manner, each time the jitter detector 80 adjusts the phase of the retiming clock 96, a corresponding adjustment is made by the phase shifting circuit 32 to the phases of the early and late clocks 98, 100, which define the jitter detection window.

Referring again to FIG. 8, when first initialized, the delay elements are set such that the jitter detection window is very narrow (i.e., t1 is initialized to a small value above zero). As data edges occur outside the jitter detection window, the retimed clock phase 96 is shifted and the jitter detection window is adjusted in the appropriate direction. The feedback 104, 106 will eventually force the jitter detection window to expand to contain the jitter histogram. Since the retiming clock 96 is shifted with the jitter detection window adjustments, the final locking position of the retiming clock 96 is ideally placed with respect to the input data edges (as in FIG. 2.)

Figure 9:
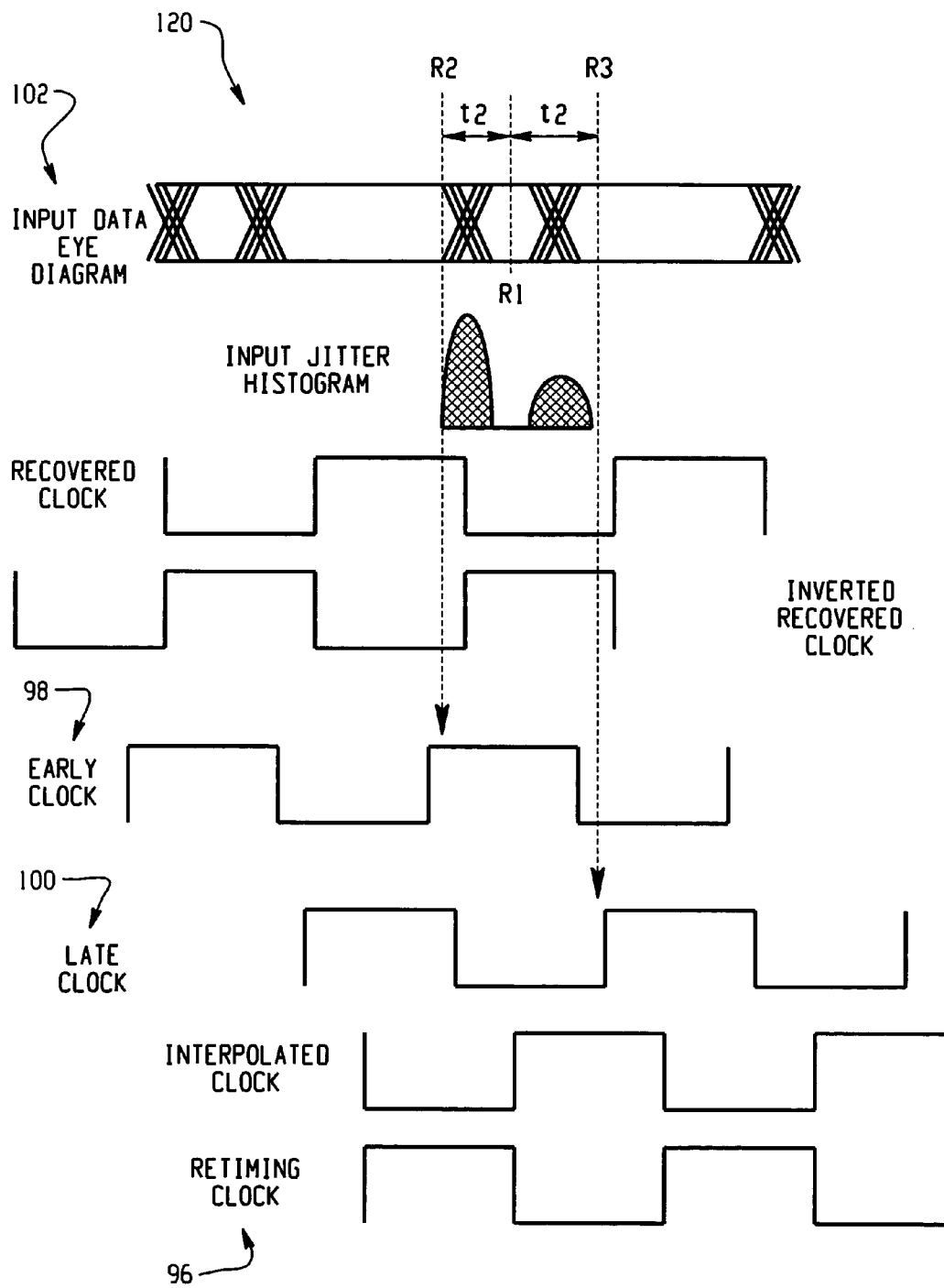
FIG. 9 illustrates an example operation of the jitter detector of FIG. 7, wherein the input jitter distribution is asymmetric.

The example of FIG. 8 illustrates an input jitter distribution that is symmetric about the natural lock position (i.e., the retiming clock and the recovered clock are in phase.) That is, the retiming clock 96 is not shifted with respect to the recovered clock in the example of FIG. 8 because the input jitter histogram is Gaussian. FIG. 9 illustrates an example operation 120 of the jitter detector 80 of FIG. 7 when the input jitter distribution is asymmetric. In this example, the recovered clock signal (i.e., the initial phase of the retiming clock 96) is not centered with respect to the jitter detection window. As a result, data edges will initially occur outside of the jitter detection window to the right of the R3, causing a logic high state on the late control output 106 and forcing the retiming clock 96 to be shifted to the right and the jitter detection window to expand. The resultant retiming clock 96 and jitter detection window are illustrated, wherein the falling edge of the retiming clock 96 is centered at R1 and the input jitter histogram in entirely within the jitter detection window. Other associated intermediate clocks are also illustrated in FIG. 9.

Figure 10:
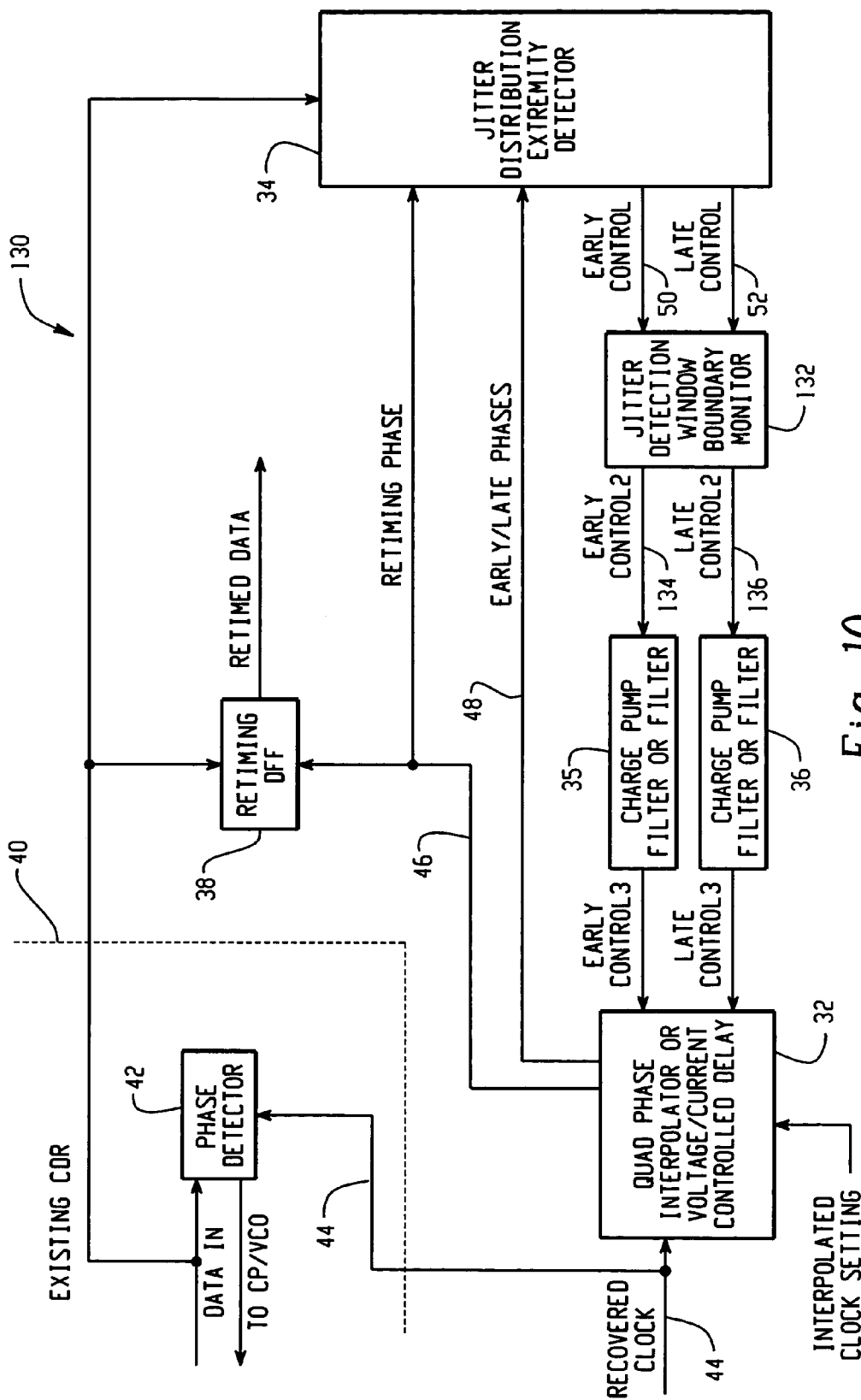
FIG. 10 is a block diagram of another example adaptive lock position circuit.

FIG. 10 is a block diagram of another example adaptive lock position circuit 130. This circuit 130 is similar to the adaptive lock position circuit 30 of FIG. 3, with the addition of a jitter detection window boundary monitor circuitry (boundary monitor) 132. In operation, the boundary monitor 132 makes the adaptive lock position circuit 130 further responsive to changes in the input jitter distribution (histogram) by causing the jitter detection window to also adapt when the input jitter is reduced. More particularly, the boundary monitor 132 monitors the ratio of data edges that fall outside of the extremities of the jitter detection window to the total edges that have occurred. The monitored ratio is compared with a predefined threshold ratio to ensure that the predefined ratio is maintained. If the input jitter distribution is reduced, then fewer data edges will occur outside of the jitter detection window, thereby decreasing the monitored ratio and causing the boundary monitor to shrink the boundaries of the jitter detection window. A more detailed example of the boundary monitor 132 is provided below with reference to FIG. 12.

Figure 11:
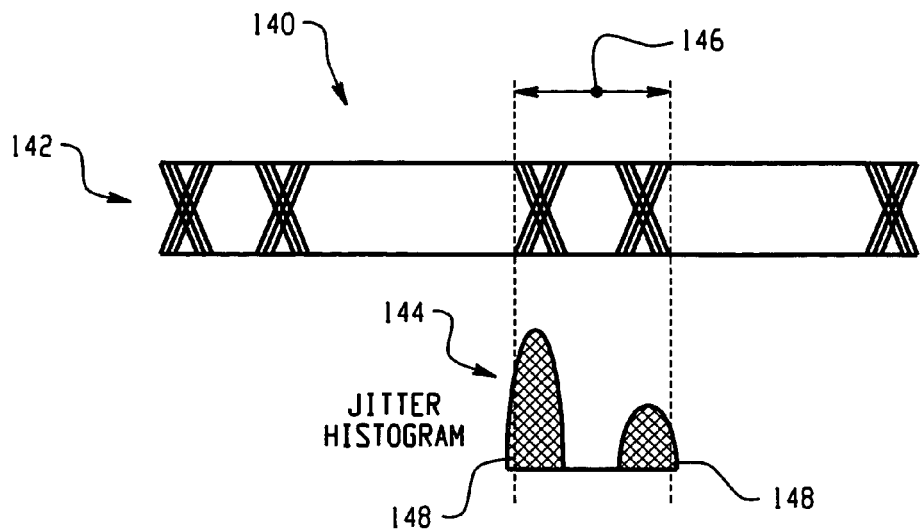
FIG. 11 further illustrates the functionality of the boundary monitor shown in FIG. 10.

FIG. 11 further illustrates the functionality of the boundary monitor 132 of FIG. 10. Shown in FIG. 11 is an input data eye diagram 142 and corresponding input jitter histogram 144. The jitter detection window 146 maintained by the adaptive lock position circuit 130 of FIG. 10 is illustrated by the vertical dashed lines in FIG. 11. The boundary monitor 132 allows a predetermined ratio of data edges to occur outside of the boundaries of the jitter detection window 146, as illustrated by the data edges 148 occurring outside of the vertical dashed lines. For example, if the edge ratio is defined as 1E-07 ($1 \times 10^{-7}$), then approximately one data edge will be allowed to occur outside of the jitter detection window 146 for every $10 \times 10^6$ edges. The boundary monitor 132 will maintain the illustrated jitter detection window 146 as long as the input jitter histogram remains unchanged. If the input jitter is reduced, however, then the boundary monitor 132 will detect a reduction in the edge ratio (e.g., less than 1 edge in $10 \times 10^6$) and the jitter detection window 146 would be decreased until the predefined edge ratio is re-attained. Similarly, if the input jitter is increased above the predefined edge ratio, then the jitter detection window 146 would be increased.

Figure 12:
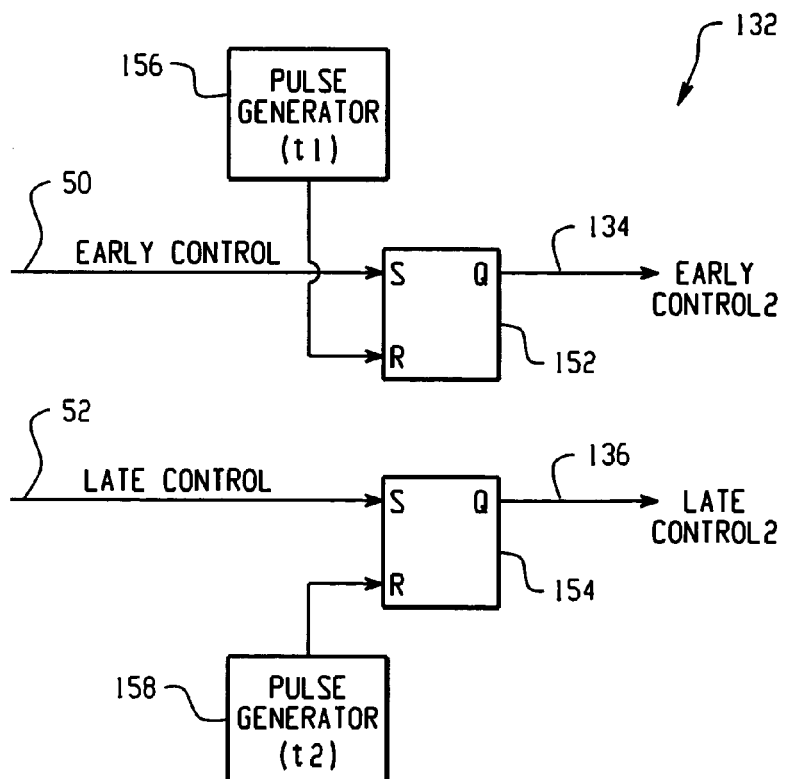
FIG. 12 is a block diagram of an example boundary monitor.

FIG. 12 is a block diagram of an example boundary monitor 132. The boundary monitor 132 includes an early control signal RS latch 152, a late control signal RS latch 154, a first pulse generator (t1) 156 and a second pulse generator (t2) 158. With reference to FIG. 10, the boundary monitor 132 receives early and late control signals 50, 52 from the jitter detector 34 and outputs secondary early and late control signals (early control 2, late control 2) 134, 136 to the charge pump(s) 35, 36.

The early and late control signals 50, 52 from the jitter detector 34 set the early control signal latch 152 and the late control signal latch 154, respectively. If the early or late control signals 50, 52 transition to a logic high state, then the output (early control 2, late control 2) 134, 136 of the respective control signal latch 152, 154 will be latched in a logic high state. The latch output (early control 2 or late control 2) is set back to a logic low state when the 'R' input to the latch transitions to a logic high state. The pulse generator circuits 156, 158 generate a logic high pulse at regular intervals (every t1 and t2 seconds, respectively.) Thus, every t1 seconds, the output (early control 2) 134 of the early control signal latch 152 is reset to a logic low state. Similarly, every t2 seconds, the output 136 (late control 2) of the late control signal latch 154 is reset to a logic low state. The values of t1 and t2 may be pre-selected to set the desired edge ratio, as discussed above.

In operation, if the jitter detect window 146 is too large (i.e., the input jitter is reduced), then the pulse generators 156, 158 will keep resetting the control signal latches 152, 154 until the pre-selected edge ratio is achieved. When the system 130 converges to the correct window width 146 to achieve the pre-selected edge ratio, the latch outputs (early control 2, late control 2) 134, 136 will be set high, then reset low over the times t1 and t2. If the jitter detect window 146 is too small (i.e., the input jitter is increased), then the control latches 152, 154 will be set more often by the early and late control inputs 50, 52 than they are reset by the pulse generators 156, 158. Thus, the jitter detection window 146 will increase until it is large enough to again reach the convergence point, achieving the pre-selected edge ratio.

Figure 13:
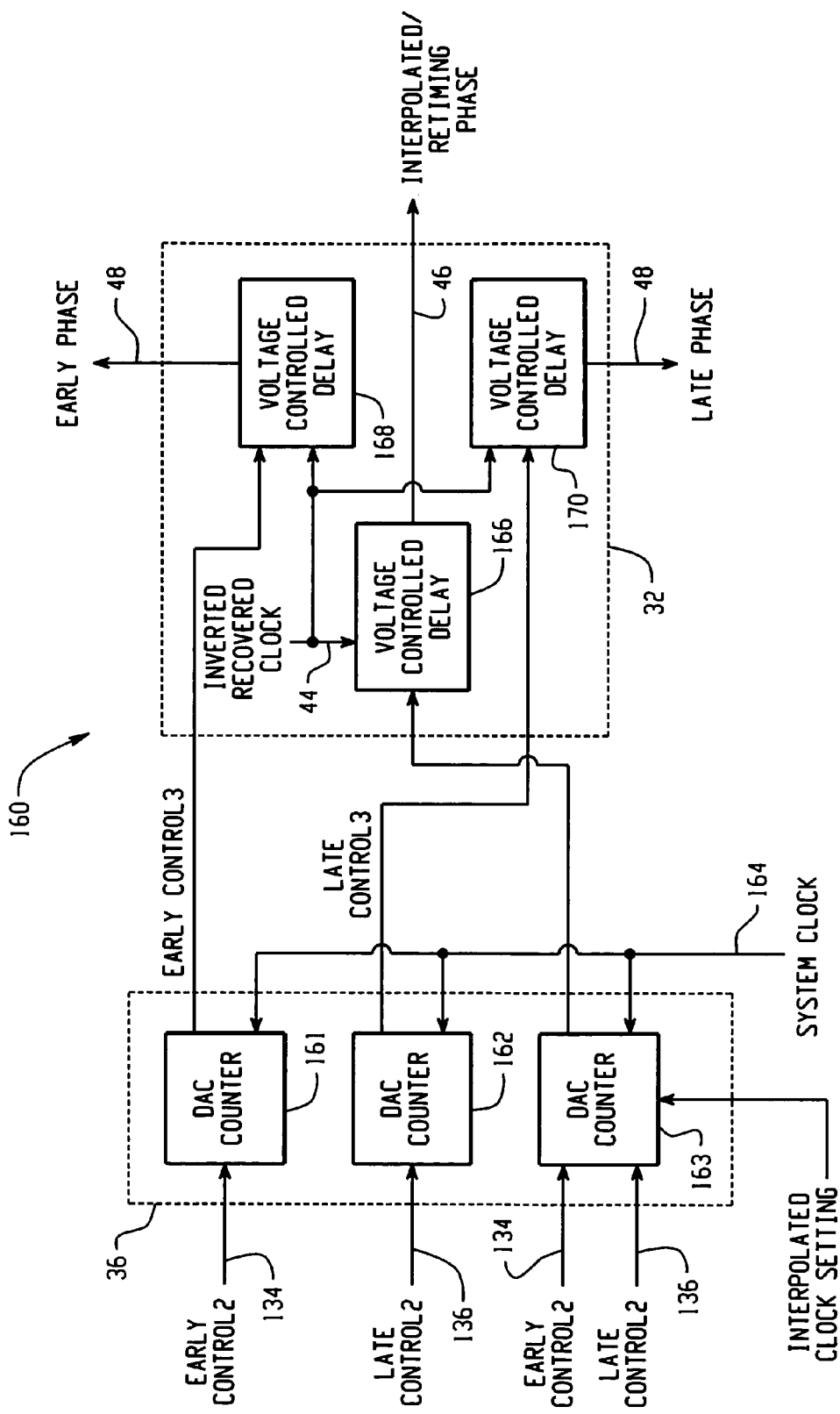
FIG. 13 is a block diagram of an example charge pump and phase shifting circuit for the adaptive lock position system of FIG. 10.

FIG. 13 is a block diagram 160 of an example charge pump 35, 36 and phase shifting circuit 32 for the adaptive lock position system 130 of FIG. 10. The example charge pump 35, 36 includes three DAC counters 161–163, which are clocked by a very low frequency system clock 164 to convert the early and late control signals 134, 136 (early control 2 and late control 2) into analog outputs (early ctrl3 and late clrl3.) For each cycle of the system clock 164, the digital count is updated, and the appropriate analog voltage is set at the output of the counters 161–163. The analog outputs from the DAC counters 161–163 control the phases of the retiming clock signal 46 and early and late clock phase signal 48 generated by the phase shifting circuit 32. More particularly, a first DAC counter 161 converts the early control signal 134 (early control 2) into an analog output, a second DAC counter 162 converts the late control signal 136 (late control 2) into an analog output, and a third DAC counter 163 converts an average of the early and late control signals 134, 136 into an analog output. The analog output of the DAC counter 163 sets an interpolated clock phase that is the midpoint of the early and late clock phases. The analog output voltage con be adjusted via the interpolated clock setting input to the third DAC counter 163 to set an interpolated clock phase that is slightly before or after the midpoint of the early and late clock phases 48.

The example phase shifting circuit 32 includes three voltage controlled delay circuitries 166, 168, 170. A first voltage controlled delay 166 shifts the phase of the inverted recovered clock signal 44 as a function of the analog output from the third DAC counter 163 to generate the retiming clock signal 46. A second voltage controlled delay 168 shifts the phase of the inverted recovered clock signal 44 as a function of the analog output from the first DAC counter 161 to generate the early clock phase signal 48. A third voltage controlled delay 170 shifts the phase of the inverted recovered clock signal 44 as a function of the analog output from the second DAC counter 162 to generate the late clock phase signal 48.

This written description uses examples to disclose the invention, including the best mode, and also to enable a person skilled in the art to make and use the invention. The patentable scope of the invention may include other examples that occur to those skilled in the art.

It is claimed:

1. An adaptive lock position circuit, comprising:
   a jitter distribution extremity detector that receives an input data signal, the jitter distribution extremity detector being operable to compare the input data signal with a recovered clock signal from a clock and data recovery (CDR) circuit to generate one or more control signals that define boundaries of a jitter extremity detection window; and
   a phase shifting circuit coupled in a feedback loop with the jitter distribution extremity detector that receives the one or more control signals from the jitter distribution extremity detector and also receives the recovered clock signal, the phase shifting circuit being operable to shift the phase of the recovered clock signal as a function of the one or more control signals to generate a retiming clock signal such that an edge of the retiming clock signal is interpolated within the jitter extremity detection window.

2. The adaptive lock position circuit of claim 1, wherein the jitter distribution extremity detector compares the input data signal with one or more clock signals derived from the recovered clock signal to generate the one or more control signals.

3. The adaptive lock position circuit of claim 1, wherein the retiming clock signal is centered within the jitter extremity detection window.

4. The adaptive lock position circuit of claim 1, wherein the retiming clock signal is extrapolated using information provided by the jitter distribution extremity detector.

5. The adaptive lock position circuit of claim 1, wherein the phase shifting circuit receives an interpolated clock setting signal that is used to adjust the phase of the retiming clock signal within the jitter extremity detection window.

6. The adaptive lock position circuit of claim 2, wherein the jitter distribution extremity detector generates an early control signal that defines a first boundary of the boundaries of the jitter extremity detection window and a late control signal that defines a second boundary of the boundaries of the jitter extremity detection window.

7. The adaptive lock position circuit of claim 6, wherein the phase shifting circuit generates an early clock signal and a late clock signal by shifting the phase of the recovered clock signal as a function of the early and late control signals, and wherein the early and late clock signals define the jitter extremity detection window.

8. The adaptive lock position circuit of claim 7, wherein the retiming clock signal is generated from the early and late clock signals.

9. The adaptive lock position circuit of claim 8, wherein the jitter distribution extremity detector comprises:
    a first primary stage latch that samples the retiming clock signal at an edge of the input data signal to generate a phase error signal;
    a second primary state latch that samples the early clock signal at an edge of the input data signal to generate a first jitter detection window signal;
    a third primary stage latch that samples the late clock signal at an edge of the input data signal to generate a second jitter detection window signal; and
    a secondary stage circuitry that generates the early and late control signals by combining the phase error signal and the first and second jitter detection window signals.

10. The adaptive lock position circuit of claim 9, wherein the secondary stage circuitry comprises:
    a first secondary stage latch that samples the phase error signal at an edge of the first jitter detection window signal to generate a first output signal;
    a second secondary stage latch that samples the phase error signal at an edge of the second jitter detection window signal to generate a second output signal;
    a first logic gate that combines the first output signal and the first jitter detection window signal to generate the early control signal; and
    a second logic gate that combines the second output signal and the second jitter detection window signal to generate the late control signal.

11. The adaptive lock position circuit of claim 2, further comprising:
    a charge pump circuit coupled between the jitter distribution extremity detector and the phase shifting circuit, the charge pump circuit being operable to convert the one or more control signals into one or more analog control signals, wherein the phase shifting circuit shifts the phase of the recovered clock signal as a function of the one or more analog control signals.

12. The adaptive lock position circuit of claim 11, wherein the jitter distribution extremity detector generates an early control signal that defines a first boundary of the boundaries of the jitter extremity detection window and a late control signal that defines a second boundary of the boundaries of the jitter extremity detection window, and wherein the charge pump circuit comprises:
    a first DAC counter that converts the early control signal into an analog early control signal; and
    a second DAC counter that converts the late control signal into an analog late control signal.

13. The adaptive lock position circuit of claim 12, wherein the phase shifting circuit comprises:
    a first voltage controlled delay circuit that generates an early phase signal as a function of the analog early control signal; and
    a second voltage controlled delay circuit that generates a late phase signal as a function of the analog late control signal.

14. The adaptive lock position circuit of claim 13, wherein:
    the charge pump circuit includes a third DAC counter that converts an average of the early control signal and the late control signal into an analog retiming signal; and
    the phase shifting circuit includes a third voltage controlled delay circuit that generates the retiming clock signal as a function of the analog retiming signal.

15. The adaptive lock position circuit of claim 14, wherein the third DAC counter receives an interpolated clock setting signal that adjusts the analog retiming signal in order to adjust the phase of the retiming clock signal within the jitter extremity detection window.

16. The adaptive lock position circuit of claim 11, wherein:
    the jitter distribution extremity detector generates an early control signal that defines a first boundary of the boundaries of the jitter extremity detection window and a late control signal that defines a second boundary of the boundaries of the jitter extremity detection window; and
    the charge pump circuit includes a first charge pump operable to convert the early control signal into a first analog signal and a second charge pump operable to convert the late control signal into a second analog signal, wherein the phase shifting circuit shifts the phase of the recovered clock signal as a function of the first and second analog signals.

17. The adaptive lock position circuit of claim 2, further comprising:
    a jitter detection window boundary monitor coupled between the jitter distribution extremity detector and the phase shifting circuit, the jitter detection window boundary monitor being operable to adjust the one or more control signals to maintain a pre-selected ratio of data edges from the input data signal that occur outside of the jitter extremity detection window to data edges from the input data signal that occur within the jitter extremity detection window.

18. The adaptive lock position circuit of claim 17, wherein:
    the jitter distribution extremity detector generates an early control signal that defines a first boundary of the jitter extremity detection window and a late control signal that defines a second boundary of the jitter extremity detection window;
    the jitter detection window boundary monitor being operable to adjust the early control signal and the late control signal to maintain the pre-selected ratio.

19. The adaptive lock position circuit of claim 18, wherein the jitter detection window boundary monitor comprises:

a first pulse generator that generates a first timed signal a second pulse generator that generates a second timed signal an early control signal RS latch that receives the early control signal as a set input and receives the first timed signal as a reset input and generates an adjusted early control output; and a late control signal RS latch that receives the late control signal as a set input and receives the second timed signal as a reset input and generates an adjusted late control output.

20. A method for generating a retiming clock signal for a clock and data recovery circuit, comprising:

receiving an input data signal;

comparing the input data signal with a recovered clock signal from the clock and data recovery circuit to generate one or more control signals that define boundaries of a jitter extremity detection window; and shifting the phase of the recovered clock signal as a function of the one or more control signals to generate the retiming clock signal such that an edge of the retiming clock signal is interpolated within the jitter detection window.

21. The method of claim 20, further comprising:

deriving one or more clock signals from the recovered clock signal, wherein the input data signal is compared with the one or more clock signals to generate the one or more control signals that define the boundaries of the jitter extremity detection window.

22. The method of claim 20, further comprising:

receiving an interpolated clock signal; and adjusting the phase of the retiming clock signal within the jitter extremity detection window based on the interpolated clock signal.

23. An adaptive lock position circuit, comprising:

means for comparing an input data signal with a recovered clock signal from a clock and data recovery (CDR) circuit to generate one or more control signals that define boundaries of a jitter extremity detection window; and means for shifting the phase of the recovered clock signal as a function of the one or more control signals to generate a retiming clock signal such that an edge of the retiming clock signal is interpolated within the jitter extremity detection window.

24. The adaptive lock position circuit of claim 23, wherein the input data signal is compared with one or more clock signals derived from the recovered clock signal to generate the one or more control signals.

25. The adaptive lock position circuit of claim 24, further comprising:

means for converting the one or more control signals into one or more analog control signals, wherein the phase of the recovered clock signal is shifted as a function of the one or more analog control signals.

26. The adaptive lock position circuit of claim 24, further comprising:

means for adjusting the one or more controls signals to maintain a pre-selected ratio of data edges from the input data signal that occur outside of the jitter extremity detection window to data edges from the input data signal that occur within the jitter extremity detection window.

* * * * *